(12) United States Patent
Apel

(10) Patent No.: US 6,882,240 B2
(45) Date of Patent: Apr. 19, 2005

(54) INTEGRATED SEGMENTED AND INTERDIGITATED BROADSIDE- AND EDGE-COUPLED TRANSMISSION LINES

(75) Inventor: Thomas R. Apel, Portland, OR (US)

(73) Assignee: Triquint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 10/806,851

(22) Filed: Mar. 22, 2004

(65) Prior Publication Data

US 2004/0178861 A1 Sep. 16, 2004

Related U.S. Application Data

(63) Continuation of application No. 10/121,066, filed on Apr. 11, 2002.

(51) Int. Cl.[7] .................................................. H01P 5/10
(52) U.S. Cl. ........................................ 333/25; 336/200
(58) Field of Search ...................... 333/25, 26; 336/200, 336/232, 236

(56) References Cited

U.S. PATENT DOCUMENTS

| 4,992,769 A | 2/1991 | Oppelt |
| 4,999,597 A | 3/1991 | Gaynor |
| 5,146,191 A | 9/1992 | Mandai et al. |
| 5,200,718 A | 4/1993 | Kato |
| 5,430,424 A | 7/1995 | Sato et al. |
| 5,497,137 A | 3/1996 | Fujiki |
| 5,767,753 A | 6/1998 | Ruelke |
| 5,793,272 A | 8/1998 | Burghartz et al. |
| 5,852,866 A | 12/1998 | Kuettner et al. |
| 5,877,667 A | 3/1999 | Wollesen |
| 5,884,990 A | 3/1999 | Burghartz et al. |
| 5,892,668 A | 4/1999 | Okamoto et al. |
| 5,969,590 A | 10/1999 | Gutierrez |
| 6,097,273 A | 8/2000 | Frye et al. |
| 6,198,374 B1 | 3/2001 | Abel |
| 6,263,198 B1 | 7/2001 | Li |
| 6,278,340 B1 | 8/2001 | Liu |
| 6,317,965 B1 | 11/2001 | Okamoto et al. |
| 6,396,362 B1 * | 5/2002 | Mourant et al. ............... 333/25 |
| 6,407,647 B1 | 6/2002 | Apel et al. |
| 6,437,658 B1 | 8/2002 | Apel et al. |

FOREIGN PATENT DOCUMENTS

EP           1037300 A1      9/2000

OTHER PUBLICATIONS

Engels, M., and Jansen, R. H., "A Novel Compact Balun Structure for Multilayer MMICs," 26th EuMC, Sep. 9–12, 1996, Hotel Hilton Atrium, Prague, Czech Republic, pp. 692–696.

(Continued)

Primary Examiner—Robert Pascal
Assistant Examiner—Dean Takaoka
(74) Attorney, Agent, or Firm—Bever Hoffman & Harms

(57) ABSTRACT

A transmission line element is formed in an integrated circuit chip. The transmission line element includes a plurality of parallel conductors, with each conductor including a plurality of electrically connected transmission lines. At least two of the transmission lines of each conductor are in different ones of plural metal layers of the integrated circuit chip. The metal layers are separated by at least one dielectric layer. Each transmission line in each conductor is edge-coupled to a transmission line of another of the conductors, and broadside-coupled to a transmission line of another of the conductors. The transmission line element can be used, for example, to fabricate various types of balanced and unbalanced transformers.

26 Claims, 12 Drawing Sheets

OTHER PUBLICATIONS

Brown et al. "Printed Microwave Couplers With Thermal Isolation," 1997 IEEE MTT–S International Microwave Symposium Digest; Denver, Jun. 8–13, 1997, IEEE vol. 2, pp. 983–986.

Toyoda, Ichihiko, et al. "Three–Dimensional MMIC and Its Application: An Ultra–Wideband Miniature Balun," IEICE Trans. Electron., vol. E78–C, No. 8, Aug. 1995, pp. 919–924.

Engels, M., and Jansen, R. H., "Modeling and Design of Novel Passive MMIC Components With Three and More Conductor Levels," 1994 IEEE MTT–S Digest (1994), pp. 1293–1296.

Cho, Choonsik, et al. "A New Design Procedure for Single–Layer and Two–Layer Three–Line Baluns," IEEE Transactions on Microwave Theory and Techniques, vol. 46, No. 12, Dec. 1998, pp. 2514–2519.

* cited by examiner

Bottom Metal

Middle Metal

US 6,882,240 B2

INTEGRATED SEGMENTED AND INTERDIGITATED BROADSIDE- AND EDGE-COUPLED TRANSMISSION LINES

REFERENCE TO RELATED APPLICATIONS

This application is a continuation of U.S. patent application Ser. No. 10/121,066, filed on Apr. 11, 2002. This application is related to commonly owned U.S. patent application Ser. No. 09/768,865, filed Jan. 23, 2001, issued as U.S. Pat. No. 6,407,647 on Jun. 18, 2002, and U.S. patent application Ser. No. 09/863,779, filed May 22, 2001, issued as U.S. Pat. No. 6,437,658on Aug. 20, 2002, each of which is incorporated herein by reference in its entirety.

FIELD OF THE INVENTION

The present invention relates to impedance transforming elements, and in particular to segmented and interdigitated integrated coupled transmission line elements.

BACKGROUND OF THE INVENTION

The use of twisted pairs of copper wires to form coupled transmission line elements is well known. These transmission line elements may be used to create balanced and unbalanced transmission lines, balanced-unbalanced (balun) transmission lines, and current and voltage inverters. Examples of the use of conventional transmission line elements are presented in C. L. Ruthroff, "Some Broad-Band Transformers," *Proceedings of the IRE* (*Institute for Radio Engineers*), vol. 47, pp. 1337–1342 (August 1959), which is incorporated herein by reference. These transmission line elements are typically found in forms that are useful in frequency bands through UHF.

The use of such transmission line elements in integrated circuits such as RF power amplifiers and low noise amplifiers that operate at higher than UHF frequencies is desirable. However, the incorporation of these conventional transmission line elements into RF devices such as cellular telephones is not competitively feasible due to size and cost. Moreover, conventional coupled transmission line elements are not suitable for use in the desired frequency range.

Therefore, a need has arisen for a coupled transmission line element that addresses the disadvantages and deficiencies of the prior art.

SUMMARY OF THE INVENTION

A transmission line element in accordance with this invention comprises a plurality of metal layers that are formed in an integrated circuit chip. Each of the metal layers is separated from an adjacent metal layer by a dielectric layer. In a bifilar embodiment, a first conductor comprises at least two transmission lines in different metal layers; and a second conductor comprises at least two transmission lines also in different metal layers. The transmission lines in the first and second conductors run parallel to each other. A plurality of interconnects are located at predetermined positions along the conductors, each of the interconnects containing an electrical connection between the transmission lines in the first conductor and an electrical connection between the transmission lines in the second conductor. At least one transmission line in the first conductor is edge-coupled to at least one transmission line in the second conductor and broadside-coupled to at least one other transmission line in the second conductor.

In addition, at least a second transmission line in said first conductor may be edge-coupled to at least one transmission line in said second conductor and broadside-coupled to at least one other transmission line in said second conductor.

The first and second conductors may be formed in the shape of a spiral or a variety of other shapes.

At least one of the interconnects may comprise a via through the dielectric layer, a first tongue extending to the via from one of said transmission lines and a second tongue extending to the via from another one of said transmission lines.

In one bifilar embodiment the first conductor comprises two transmission lines and the second conductor comprises two transmission lines. Alternatively, the first conductor comprises three transmission lines and said second conductor comprises three transmission lines.

In a trifilar embodiment the transmission line element comprises a third conductor, and each of said first, second and third conductors may comprise three transmission lines.

BRIEF DESCRIPTION OF THE DRAWINGS

For a more complete understanding of the present invention and for further features and advantages, reference is now made to the following description taken in conjunction with the accompanying drawings, in which.

DESCRIPTION OF THE INVENTION

Figure 1:
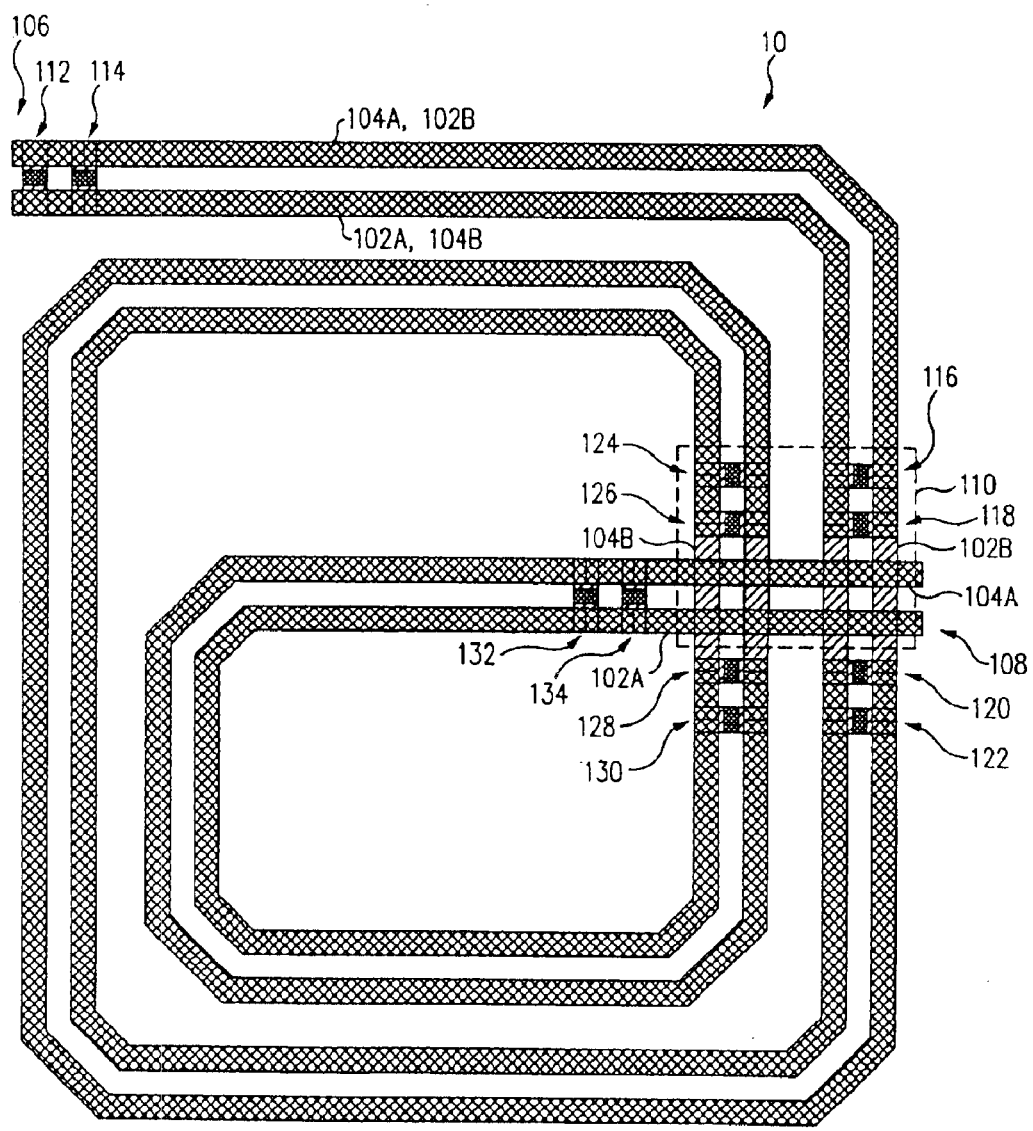
FIG. 1 is a top view of an bifilar broadside- and edge-coupled transmission line element according to the invention.
Figure 4:
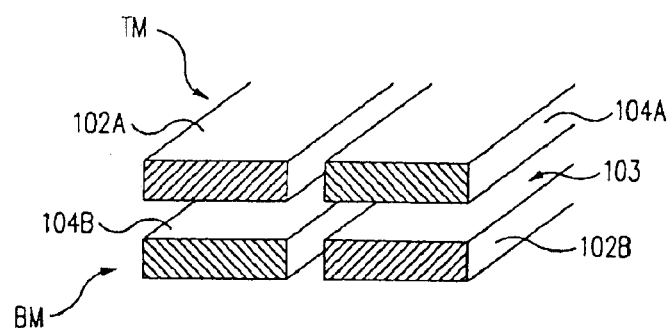
FIG. 4 is a cross-sectional view of the broadside- and edge-coupled transmission line element of FIG. 1.

FIG. 1 shows a general view of a bifilar transmission line element 10 in accordance with the invention. Bifilar element 10 includes two pairs of broadside- and edge-coupled transmission lines formed in two metal layers separated by a dielectric layer. FIG. 4 illustrates the relative positions of the transmission line pairs. Lines 104A and 102A are formed in a top metal layer TM, and lines 102B and 104B are formed in a bottom metal layer BM. The top and bottom metal layers TM and BM are separated by a dielectric layer 103. This structure is fabricated using conventional semiconductor processes that are well-known to those skilled in the art and will not be detailed here. Metal layers TM and BM may be formed, for example, of aluminum, gold, or another conductive material.

As shown in FIG. 1, the transmission line pairs extend from a first terminus 106 to a second terminus 108. While the transmission lines in FIG. 1 are laid out in the pattern of a square spiral, many other geometries may be used. For example, other spiral shapes (circular, rectangular, etc.) can be used, or the transmission lines can be linear or variety of other shapes. This invention is not limited to any particular shape of transmission lines.

Transmission lines 102A, 102B, 104A, 104B are "segmented" in the sense that at predetermined intervals line 102A is connected to line 102B, and line 104A is connected to line 104B. Lines 102A, 102B thus together constitute a first conductor 102 and lines 104A 104B together constitute a second conductor 104. The intervals between such connections are referred to as "segments". Referring to FIG. 1, the connections are made at interconnects 112, 114, 116, 118, 120, 122, 124, 126, 128, 130, 132 and 134. The length between interconnects 112, 114 (terminus 106) and interconnects 116, 118 constitutes a first segment, the length between interconnects 120, 122 and interconnects 124, 126 constitutes a second segment, and the length between interconnects 128, 130 and interconnects 132, 134 (terminus 108) constitutes a third segment. Preferably, the interconnects are spaced such that, at the operating frequency of the transformer, the segments are less than 30 degrees long.

Figure 3:
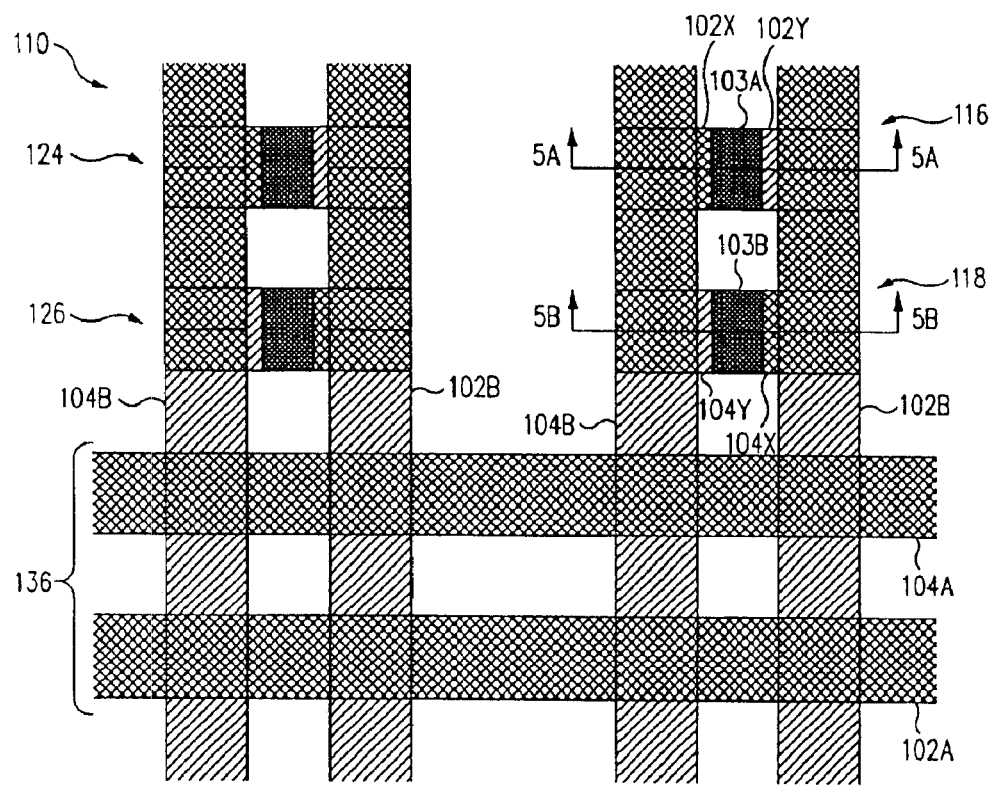
FIG. 3 is a composite view of the top and bottom metal layers in the crossover region of the transmission line element of FIG. 1.
Figure 5A:
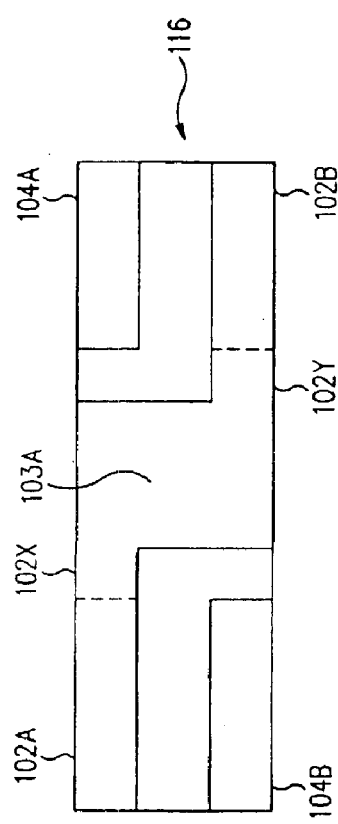
FIG. 5A is a view of the transmission line element of FIG. 1 taken at cross-section 5A—5A of FIG. 3, showing the via that connects one pair of associated transmission lines.
Figure 5B:
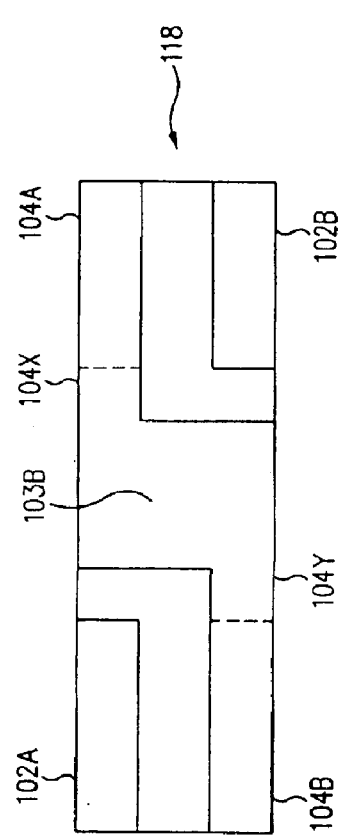
FIG. 5B is a view of the transmission lines of FIG. 1 taken at cross-section 5B—5B of FIG. 3, showing the via that connects the other pair of associated transmission lines.

FIG. 3 is a detailed view of the area 110 shown by the dashed lines in FIG. 1. Included are interconnects 116, 118, 124 and 126. The views at cross-sections 5A—5A and 5B—5B are shown in FIGS. 5A and 5B, respectively. Referring first to FIG. 5A, the top metal layer TM, which forms lines 104A and 102A, and the bottom metal layer BM, which forms lines 102B and 104B, are separated by a dielectric layer 103. Dielectric layer 103 may be made of bisbenzocyclobutene (BCB), a nitride or oxide of silicon, or some other insulating material. Dielectric layer 103 is deposited using conventional techniques.

Figure 2A:
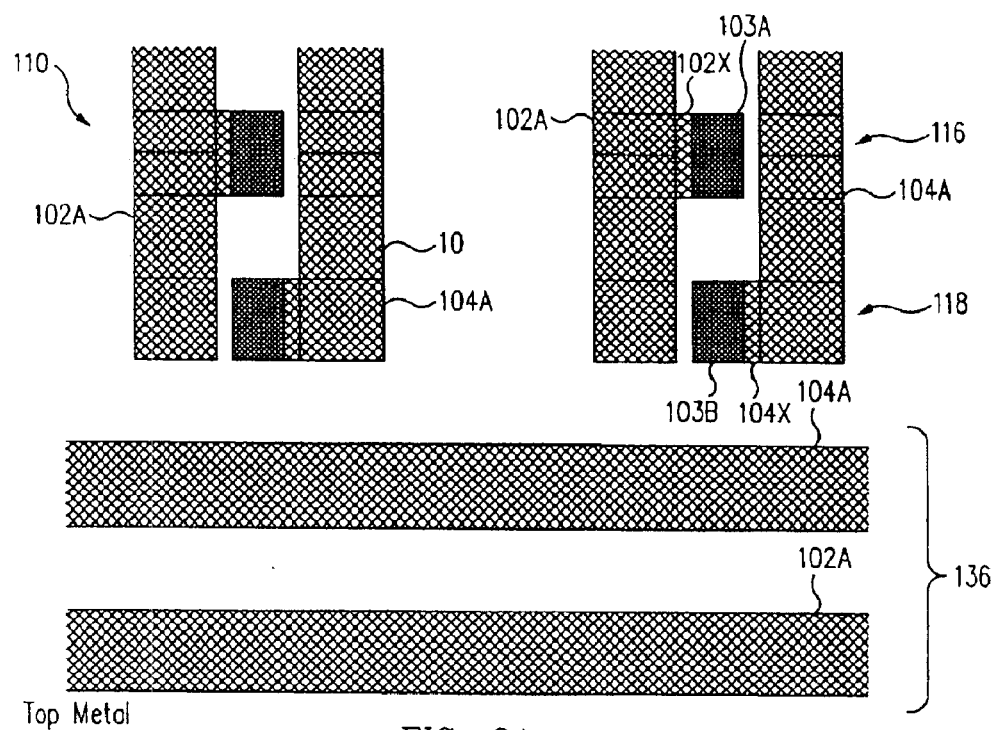
FIG. 2A is a view of the top metal layer in the crossover region of the transmission line element of FIG. 1.
Figure 2B:
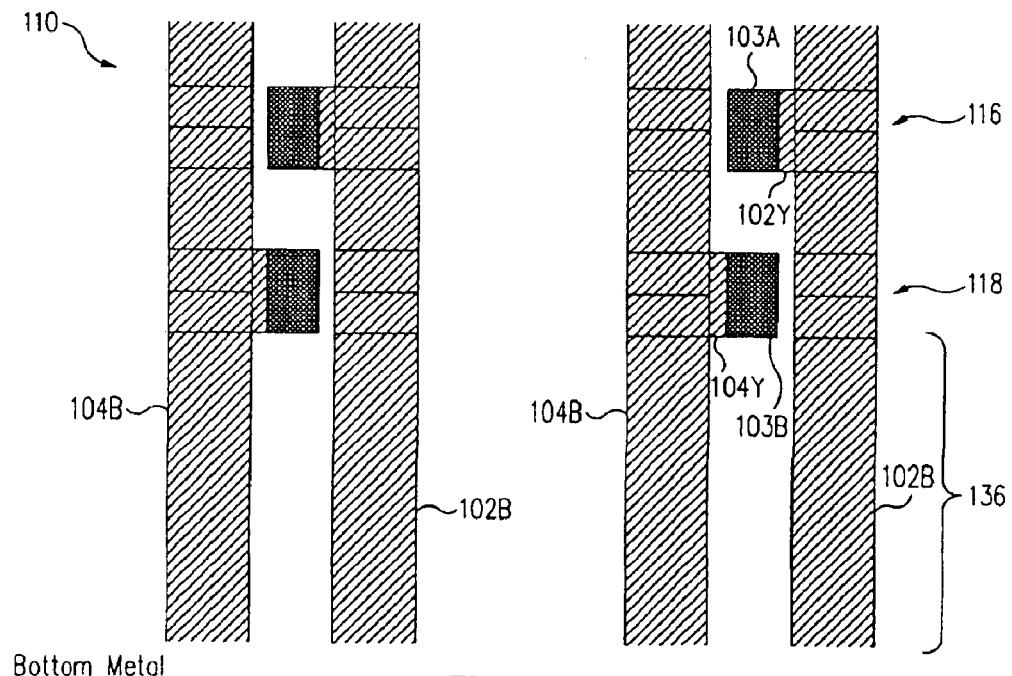
FIG. 2B is a view of the bottom metal layer in the crossover region of the transmission line element of FIG. 1.

FIG. 2A shows the top metal layer TM in area 110, and FIG. 2B shows the bottom metal layer BM in area 110. Referring to FIG. 2A, at interconnect 116 a tongue 102X extends from line 102A to a via 103A, and at interconnect 118 a tongue 104X extends from line 104A to a via 103B. Referring to FIG. 2B, at interconnect 116 a tongue 102Y extends from line 102B to via 103A, and at interconnect 118 a tongue 104Y extends from line 104B to via 103B. Thus, as shown in FIG. 5A, at interconnect 116 an electrical connection is formed between lines 102A and 102B by means of tongue 102X, the metal in via 103A, and tongue 102Y. As shown in FIG. 5B, at interconnect 118 an electrical connection is formed between lines 104A and 104B by means of tongue 104X, the metal in via 103B, and tongue 104Y. Using tongues and vias, similar connections between lines 102A and 102B and lines 104A and 104B are formed at interconnects 112, 114, 120, 122, 124, 126, 128, 130, 132 and 134.

As shown in FIGS. 2A and 2B, area 110 includes a crossover region 136, where the transmission lines cross. In crossover region 136 the top metal layer TM terminates between interconnects 118 and 120, and the bottom metal layer BM terminates between interconnect 134 and terminus 108, thereby allowing the transmission lines to pass from the inside of the spiral to terminus 108.

By reference to FIG. 4 it will be understood that broadside coupling occurs between lines 102A and 104B and between lines 104A and 102B; and edge coupling occurs between lines 102A and 104A and between lines 102B and 104B. As compared with the broadside-coupled arrangement described in the above-referenced application Ser. No. 09/768,865, the addition of segmented edge-coupling between the lines and phasing the alternate interdigitated segments increases the surface area for the RF currents and enhances the coupling coefficient. Transformer losses are significantly reduced. For example, simulated tests show a reduction of losses from −0.3 dB to −0.15 dB.

Figure 6A:
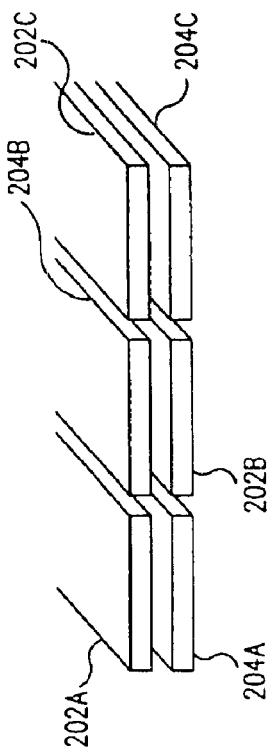
FIGS. 6A and 6B are cross-sectional views of alternative bifilar transmission line elements in accordance with the invention.
Figure 6B:
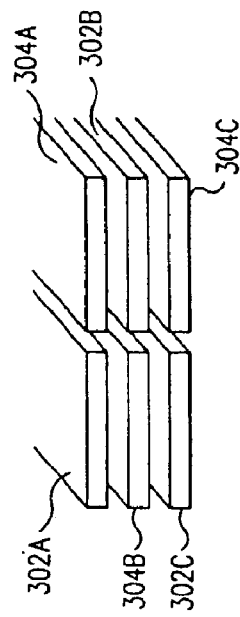

The embodiment described above is bifilar in the sense that in essence there are two conductors 102, 104 running adjacent to each other. Each conductor consists of two lines: 102A, 102B and 104A, 104B. The invention is not limited to this embodiment, however. In other bifilar embodiments, each of the two conductors may include three or more transmission lines formed in two, three or more metal layers. Two alternative embodiments are shown in FIGS. 6A and 6B. FIG. 6A shows a two-layer embodiment wherein each conductor includes three transmission lines. Transmission lines 202A, 204B and 202C are formed in the top metal layer, and transmission lines 204A, 202B and 204C are formed in the bottom metal layer. Lines 202A, 202B and 202C are connected together to form a conductor 202, and lines 204A, 204B and 204C are connected together to form a conductor 204. The connections between lines 202A–202C and 204A–204C are preferably made at interconnects similar to those shown in FIGS. 2A, 2B, 5A and 5B, the interconnects being spaced such that transmission line segments of an appropriate length are formed. FIG. 6B shows a three-layer embodiment wherein each conductor includes three transmission lines. Transmission lines 302A and 304A are formed in the top metal layer, transmission lines 302B and 304B are formed in the middle metal layer, and transmission lines 302C and 304C are formed in the bottom metal layer. Lines 302A, 302B and 302C are connected together to form a conductor 302, and lines 304A, 304B and 304C are connected together to form a conductor 304. The connections between lines 302A–302C and 304A–304C are preferably made at interconnects similar to those shown in FIGS. 2A, 2B, 5A and 5B, the interconnects being spaced such that transmission line segments of an appropriate length are formed.

In both of the embodiments shown in FIGS. 6A and 6A, it will be noted that any line that is located above, below or laterally adjacent to a given line in one of the conductors is a part of the other conductor. Taking line 202B in FIG. 6A as an example, line 204B lines directly above line 202B and lines 204A and 204C lie on opposite sides of line 202B. Line 202B is a part of conductor 202, and lines 204A, 204B and 204C are parts of conductor 204. This maximizes the extent of broadside- and edge-coupling between the signal in line 202B and the signal in lines 204A, 204B and 204C. In some embodiments, however, broadside- and edge-coupling may not be required with respect to all of the transmission lines.

The positions and locations of the termini and connecting ends shown in FIG. 1 and the accompanying diagrams are meant to be illustrative and not limiting. Other embodiments of the invention readily apparent to those skilled in the art will have such ends located in a variety of positions.

Furthermore, it is to be understood that reference to the metal layers as "top" and "bottom" is purely arbitrary and that the position of the layers with respect to each other when looking downward on them could be reversed.

As noted above, the interconnects preferably are in the form shown in FIGS. 2A, 2B, 5A and 5B, with vias being formed in the dielectric layer laterally in between adjacent transmission lines. It will be understood, however, that other techniques and structures may be used to connect the transmission lines at the interconnects.

Figure 7A:
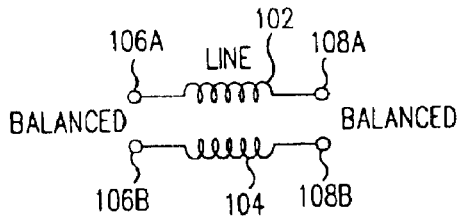
FIGS. 7A–7G are schematic circuit diagrams of various transformers that may be fabricated using the transmission line element of this invention.
Figure 7B:
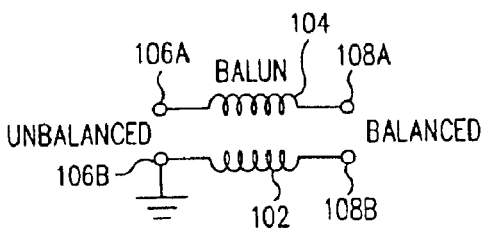
Figure 7C:
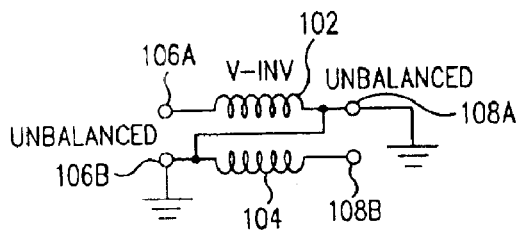
Figure 7D:
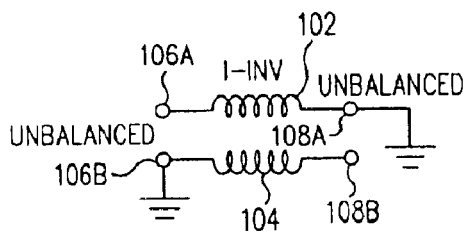
Figure 7E:
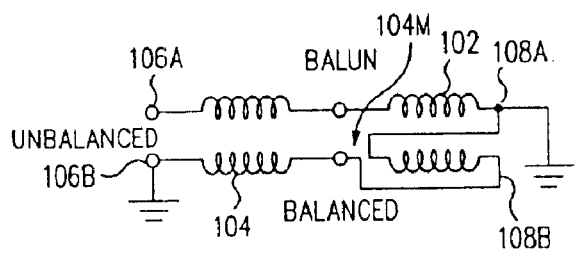
Figure 7F:
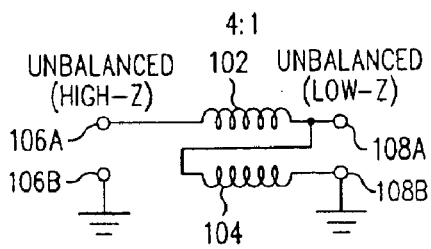

Referring again to FIG. 1, each of the conductors 102, 104 has a separate terminal at each of the termini 106 and 108. FIGS. 7A–7F illustrate how these terminals can be connected to form different types of transformers. In FIGS. 7A–7F, the terminal of conductor 102 at terminus 106 is designated 106A; the terminal of conductor 104 at terminus 106 is designated 106B; the terminal of conductor 102 at terminus 108 is designated 108A; and the terminal of conductor 104 at terminus 108 is designated 108B. Typically an input signal is applied at terminals 106A and 108A, and an output signal is generated at terminals 106B and 108B. FIG. 7A shows a balanced transformer. The version shown in FIG. 7B is similar but it is unbalanced because output terminal 106B is grounded. The embodiment of FIG. 7D is also unbalanced because both input terminal 108A and output terminal 106A are grounded. The embodiment of FIG. 7C is similar to the embodiment of FIG. 7D except that terminals 108A and 106B are tied together. Note that in the embodiments of FIGS. 7C, 7E and 7F, a connections is made between conductors 102 and 104 using vias at the specified locations in the transmission line.

The embodiments described above are bifilar, meaning that, regardless of how many transmission lines are present, they are connected together to form two conductors. Other embodiments according to this invention may include three or more separate conductors.

FIGS. 8–14 illustrate a trifilar transmission line element 401, in which there are three conductors 402, 404 and 406. Conductor 402 contains transmission lines 402A, 402B and 402C; conductor 404 contains transmission lines 404A, 404B and 404C; conductor 406 contains transmission lines 406A, 406B and 406C. Transmission line element 10 is in the form of a rectangular spiral, although any other shape could also be used, and interconnects 420, 422, 424, 426, 428, 430, 432 and 434 between the transmission lines in each conductor are formed at periodic intervals around the spiral. The spiral runs from a first terminus 412 to a second terminus 414, both of which are on the outside of the spiral, and the transmission lines run from the inside to the outside of the spiral in a crossover area 436.

Figure 8:
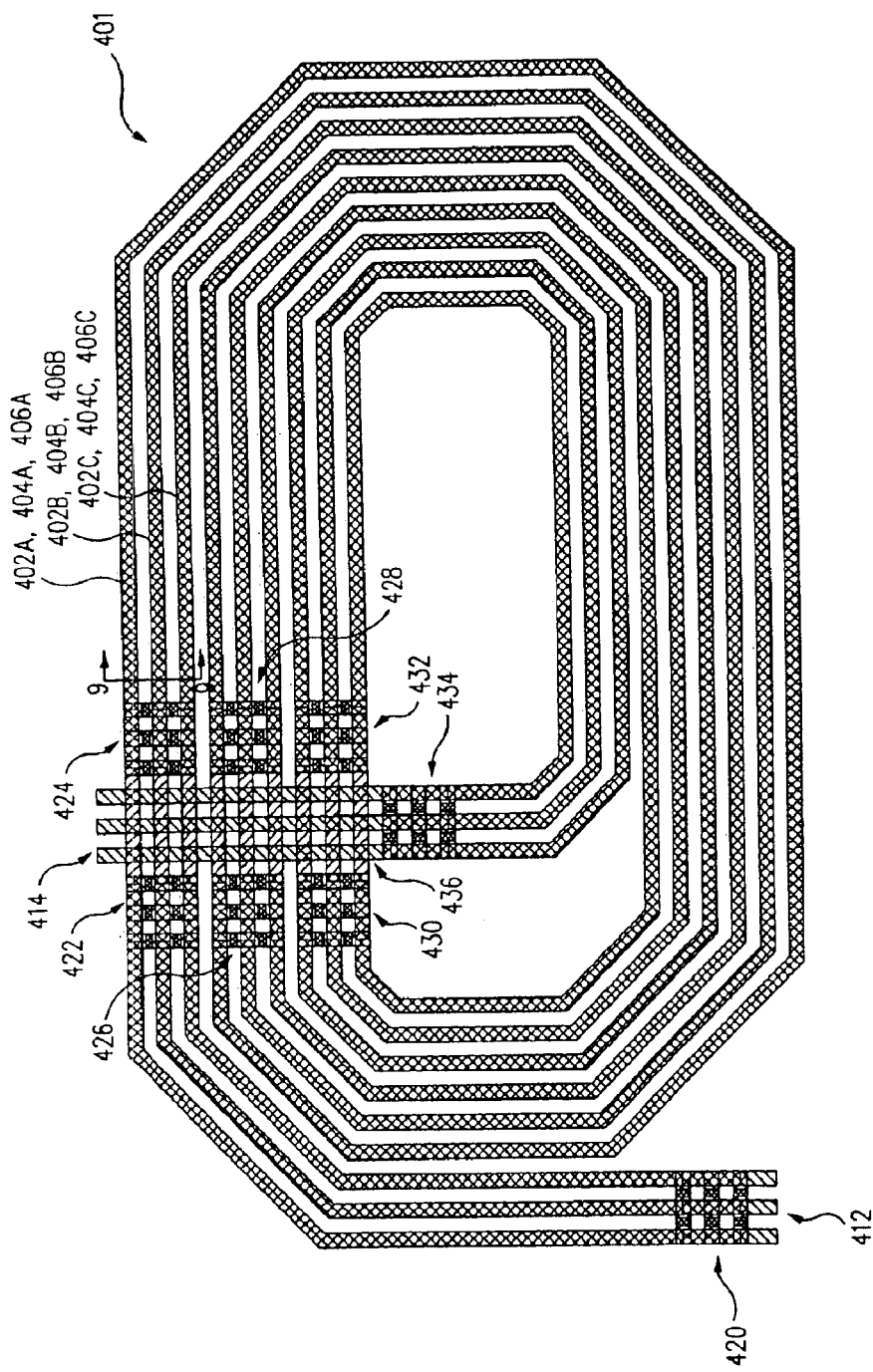
FIG. 8 is a top view of a trifilar broadside- and edge-coupled transmission line element according to the invention.
Figure 9:
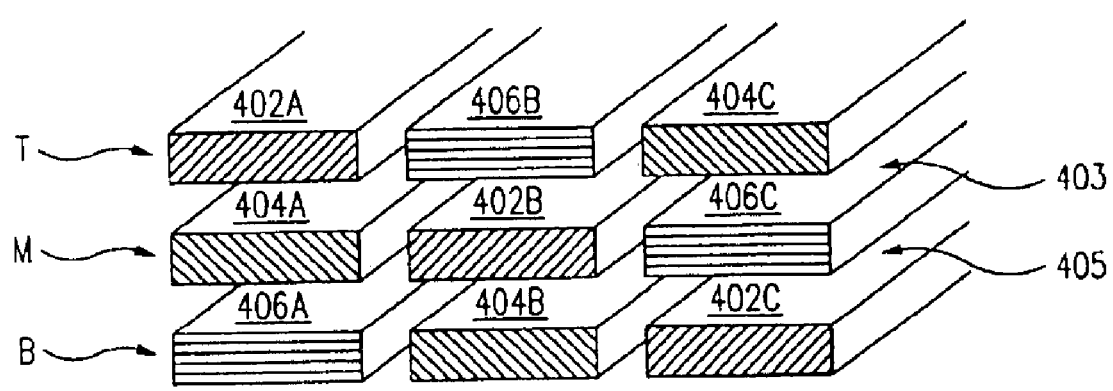
FIG. 9 is a cross-sectional view of the trifilar broadside- and edge-coupled transmission line element of FIG. 8.

The arrangement of transmission lines 402A–402C, 404A–404C, and 406A–406C is shown in FIG. 9, which is taken at cross-section 9—9 shown in FIG. 8. Lines 402C, 404B and 406A are formed in a bottom metal layer B, lines 402B, 404A and 406C are formed in a middle metal layer M, and lines 402A, 404C and 406B are formed in a top metal layer T. Bottom metal layer B and middle metal layer M are separated by a dielectric layer 405, and middle metal layer M and top metal layer T are separated by a dielectric layer 403. This stacked structure of metal lines and dielectric layers is fabricated using semiconductor processes well-known to those skilled in the art.

As FIG. 9 indicates, to maximize the broadside- and edge-coupling between the conductors, each transmission line is bounded above and/or below and laterally by transmission lines that are part of a different conductor. For example, transmission line 402B is bounded above and below by transmission lines 406B and 404B, respectively, and on opposite sides by transmission lines 404A and 406C. This configuration also provides a more uniform distribution of the capacitance between the transmission lines and ground.

Figure 10A:
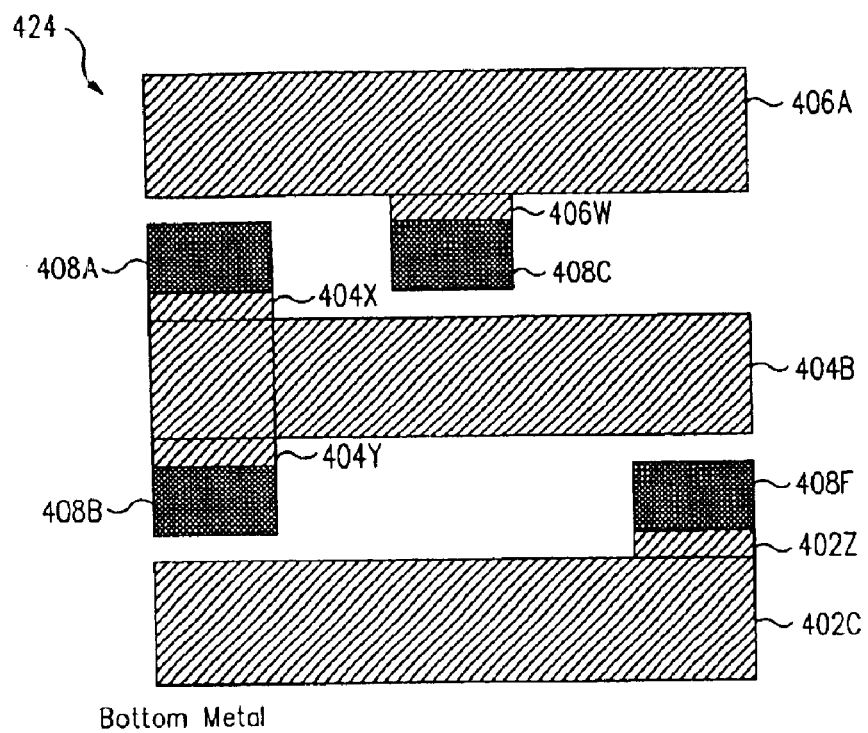
FIGS. 10A–10C are top views of the bottom, middle and top metal layers of an interconnect in the transmission line element of FIG. 8.
Figure 10B:
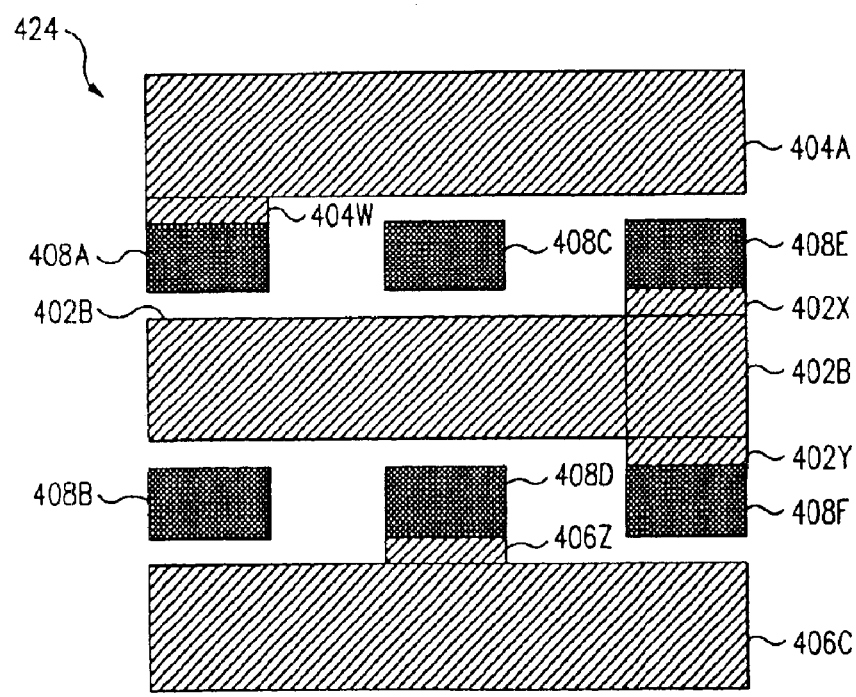
Figure 10C:
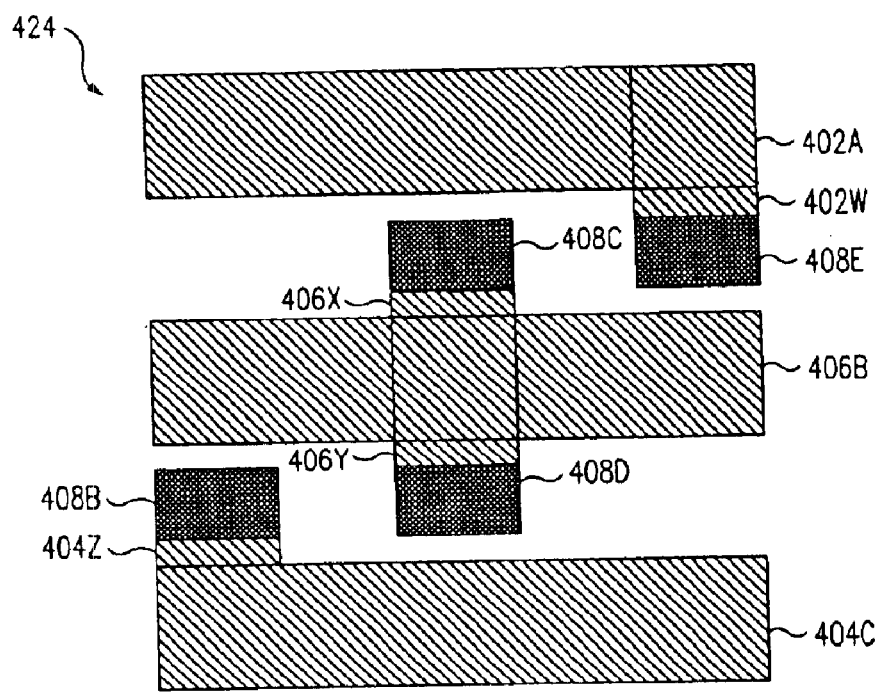
Figure 11:
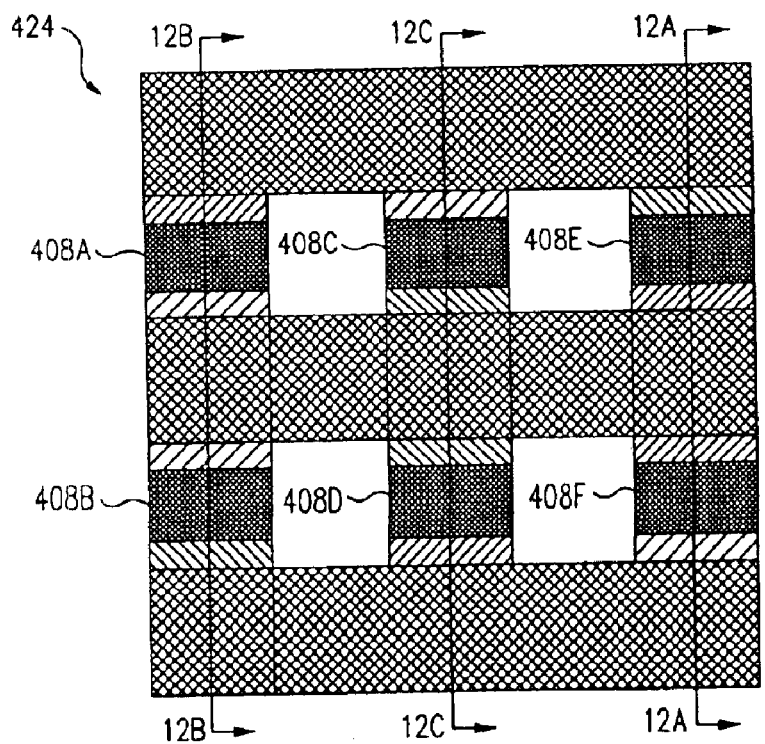
FIG. 11 is a top composite view of the interconnect in the transmission line element of FIG. 8.
Figure 12A:
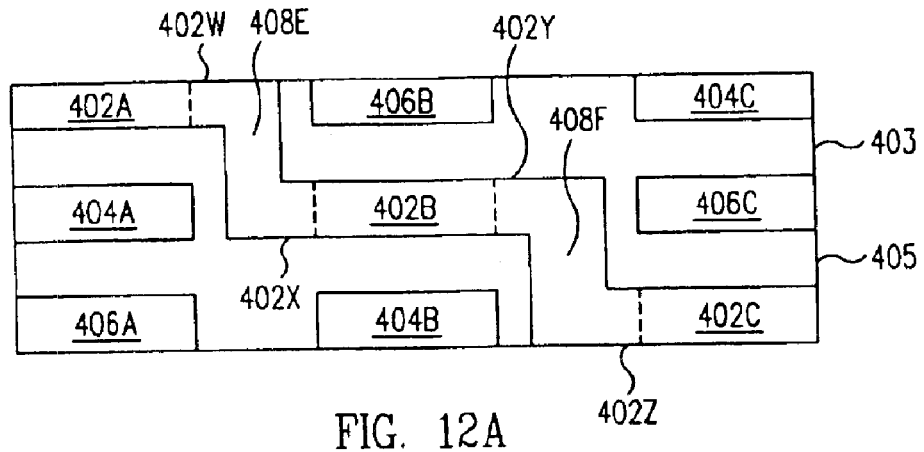
FIGS. 12A–12C are cross-sectional views of the interconnect in the transmission line element of FIG. 8.
Figure 12B:
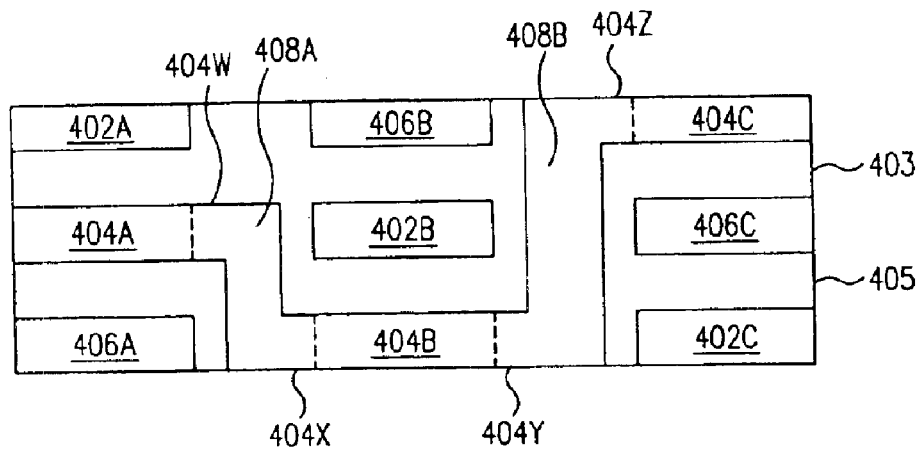
Figure 12C:
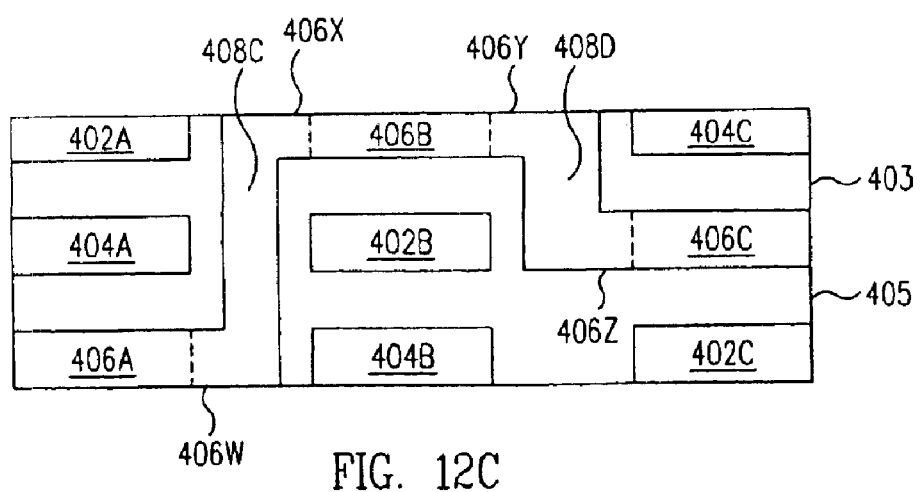

Interconnect 424 is shown in detail in FIGS. 10A–10C, 11 and 12A–12C. FIGS. 12A–12C are cross-sectional views taken at sections 12A—12A, 12B—12B and 12C—12C, respectively, shown in FIG. 11. As shown in FIG. 12A, transmission lines 402A, 402B and 402C are joined together by means of a via 408E through dielectric layer 403 and a via 408F through dielectric layer 405. Tongues 402W and 402X extend laterally from lines 402A and 402B, respectively, to make the connection between lines 402A and 402B through via 408E. Tongues 402Y and 402Z extend laterally from lines 402B and 402C, respectively, to make the connection between lines 402B and 402C through via 408E. In this manner lines 402A, 402B and 402C are joined together.

Similarly, transmission lines 404A–404C and transmission lines 406A–406C, respectively, are joined together as follows. As shown in FIG. 12B, lines 404A, 404B and 404C are joined together by means of a via 408A through dielectric layer 405 and a via 408B through dielectric layers 403 and 405. Tongues 404W and 404X extend laterally from lines 404A and 404B, respectively, to make the connection between lines 404A and 404B through via 408A. Tongues 404Y and 404Z extend laterally from lines 404B and 404C, respectively, to make the connection between lines 404B and 404C through via 4084. As shown in FIG. 12C, lines 406A, 406B and 406C are joined together by means of a via 408C through dielectric layer 403 and 405 and a via 408D through dielectric layer 403. Tongues 406W and 406X extend laterally from lines 406A and 406B, respectively, to make the connection between lines 406A and 406B through via 408C. Tongues 406Y and 406Z extend laterally from lines 406B and 406C, respectively, to make the connection between lines 406B and 406C through via 408D.

A top view of each metal layer in interconnect 424 is shown in FIGS. 10A, 10B and 10C. A composite top view of metal layers T, M and B is shown in FIG. 11.

Figure 13:
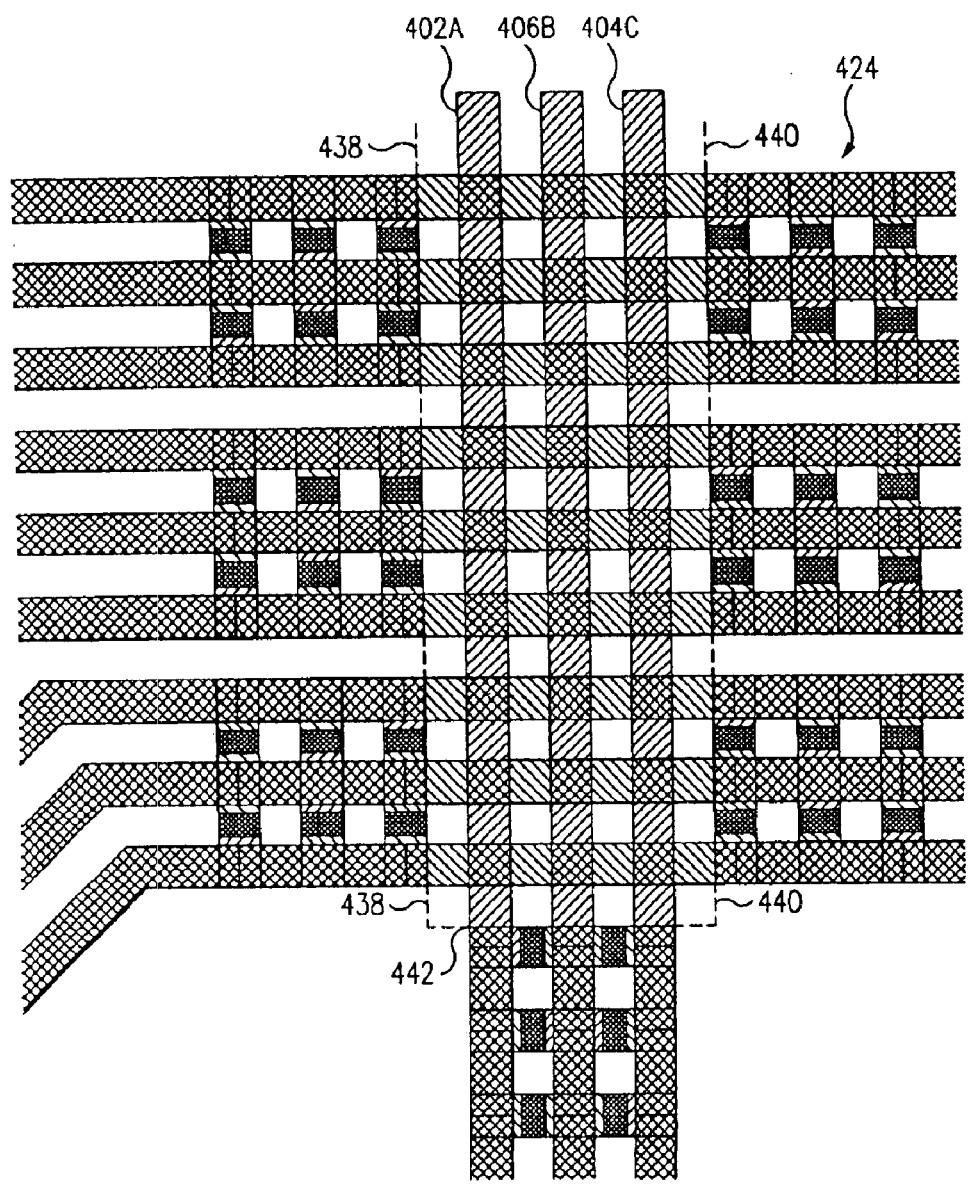
FIGS. 13 and 14 are top views of the crossover region in the transmission line element of FIG. 8.
Figure 14:
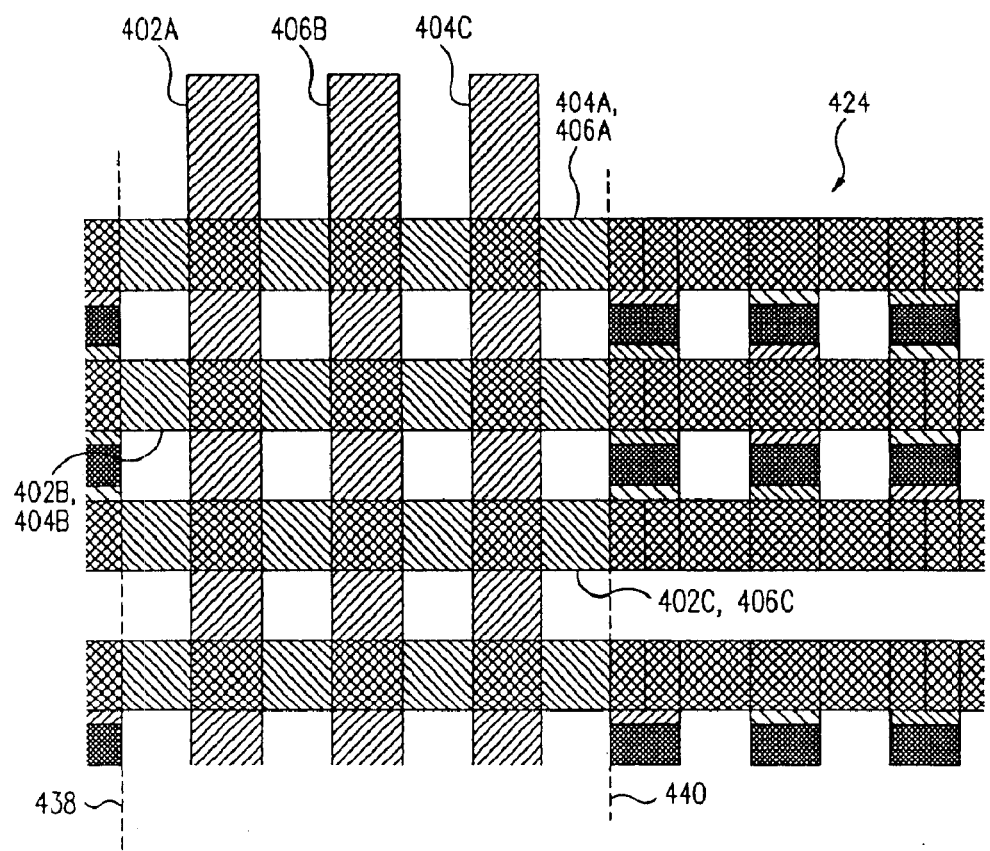

Referring again to FIG. 8, transmission line element 401 includes a crossover region 436 where the conductor pass from the inside of the spiral to terminus 414 on the outside of the spiral. Detailed views of crossover region 436 are shown in FIGS. 13 and 14. As indicated, the top metal layer T terminates at the dashed lines 438 and 440 and the middle and bottom metal layers M, B; The middle and bottom metal layers M, B terminate at the dashed line 442, and thus metal layer T passes over metal layers M, B in the crossover region 436.

Figure 7G:
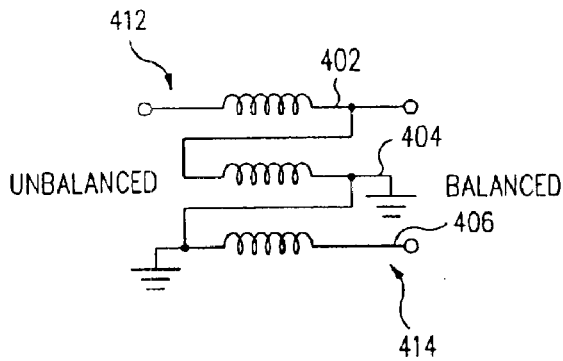

FIG. 7G is a schematic circuit diagram of a trifilar balanced-unbalanced (balun) transmission line that may be constructed using the structure illustrated in FIGS. 8–14. Conductors 402, 404 and 406 are shown, along with the terminii 412 and 414. The conductors 402, 404, 406 are connected together by vias at the locations indicated.

Although the present invention and its advantages have been described in detail, it should be understood that various changes, substitutions, and alterations can be made therein without departing from the spirit and scope of the invention as defined by the appended claims.

I claim:

1. A transmission line element, in an integrated circuit chip, comprising:

a plurality of metal layers in the integrated circuit chip, each of said metal layers being separated from an adjacent said metal layer by at least one dielectric layer;

at least first and second conductors in the integrated circuit;

the first conductor comprising at least two transmission lines, at least some of the at least two transmission lines of the first conductor being in different said metal layers, and a plurality of first electrical connections through which the at least two transmission lines are electrically connected to one another; and the second conductor comprising at least two transmission lines, at least some of the at least two transmission lines of the second conductor being in different said metal layers, and a plurality of second electrical connections through which the at least two transmission lines are electrically connected to one another, wherein the at least first and second conductors run parallel to one another, the at least two transmission lines in said at least first and second conductors run parallel to one another, at least one transmission line in each of the at least first and second conductors is edge-coupled to at least one said transmission line another said conductor and broadside-coupled to at least one said transmission line in another said conductor.

2. The transmission line element of claim 1, wherein at least a second transmission line in said at least first and second conductors is edge-coupled to at least one said transmission line in another said conductor and broadside-coupled to at least one said transmission line in another said conductor.

3. The transmission line element of claim 1,
wherein the first conductor comprises a third transmission line running parallel with the other transmission lines of the first conductor, the third transmission line being electrically connected to at least one other of the transmission lines of the first conductor, edge-coupled to at least one said transmission line in said another said conductor, and broadside-coupled to at least one other said transmission line in said second conductor, and wherein the second conductor comprises a third transmission line running parallel with the other transmission lines of the second conductor, the third transmission line being electrically connected to at least one other of the transmission lines of the second conductor, edge-coupled to at least one said transmission line in another conductor, and broadside-coupled to at least one other said transmission line in another said conductor.

4. The transmission line element of claim 3, wherein the third transmission line of the first conductor is in a same metal layer as another of the transmission lines of the first conductor, and the third transmission line of the second conductor is in a same metal layer as another of the transmission lines of the second conductor.

5. The transmission line element of claim 3, wherein the third transmission line of the first conductor is in a different said metal layer than any of the other transmission lines of the first conductor, and the third transmission line of the second conductor is in a different metal layer than any of the other transmission lines of the second conductor.

6. The transmission line element of claim 1, wherein the at least first and second transmission lines comprise a plurality of segments, with a linear length of each said segment being less than 30 degrees of an operating frequency of a transformer formed by the at least first and second conductors.

7. The transmission line element of claim 2, wherein the at least first and second transmission lines comprise a plurality of segments, with a linear length of each said segment being less than 30 degrees of an operating frequency of a transformer formed by the at least first and second conductors.

8. The transmission line element of claim 7, wherein none of the transmission lines of any of the at least first and second conductors is edge coupled or broadside coupled to any other said transmission line of the same conductor.

9. The transmission line element of claim 1, further comprising:
a third said conductor, said third conductor comprising at least two transmission lines running parallel to one another, with at least some of the transmission lines of the third conductor being in different said metal layers, and a plurality of third electrical connections through which the at least two transmission lines of the third conductor are electrically connected to one another.

10. The transmission line element of claim 9, wherein each of said first, second and third conductors comprises three transmission lines, each of the transmission lines of the respective conductor being in a different said metal layer.

11. The transmission line element of claim 1, wherein the first conductor crosses over itself and over the second conductor, and the second conductor crosses over itself and the first conductor.

12. The transmission line element of claim 1, wherein the first conductor crosses over itself, and over the second conductor, at least twice, and the second conductor crosses over itself, and over the first conductor, at least twice.

13. The transmission line element of claim 1, wherein the transmission lines of the first and second conductors in one said metal layer have a region of discontinuity between a pair of the first electrical connections and a pair of the second electrical connections, respectively, but the transmission lines of the first and second conductors in another said metal layer are continuous in the same region.

14. A transmission line element, in an integrated circuit chip, comprising:
at least a first and second metal layers, and at least one dielectric layer, in the integrated circuit, each said metal layer being separated from another said metal layer by a said dielectric layer;

at least a first transmission line and a second transmission line formed in said first metal layer;

at least a third transmission line and a fourth transmission line formed in said second metal layer,
wherein the first, second, third, and fourth transmission lines run parallel to each other, the third transmission line is vertically aligned with the first transmission line, and the fourth transmission line is vertically aligned with the second transmission line; and a plurality of metal vias each extending through at least one said dielectric layer, wherein the first and fourth transmission lines are electrically connected through at least two said vias, and the second and third transmission lines are electrically connected through at least two said vias.

15. The transmission line element of claim 14, wherein there is a third said metal layer separated by at least one said dielectric layer from the first and second metal layers, and further comprising:
fifth and sixth transmission lines formed in the third metal layer and running parallel to the first, second, third, and fourth transmission lines, wherein said fifth transmission line is vertically aligned with the first and third transmission lines, with the third transmission line being vertically between the first and fifth transmission lines, and is electrically connected to at least one of the first and fourth transmission lines through at least one said via, and wherein said sixth transmission line is vertically aligned with the second and fourth said transmission lines, with the fourth transmission line being vertically between the second and sixth transmission lines, and is electrically connected to at least one of the second and third transmission lines through at least one said via.

16. The transmission line element of claim 14, wherein there is a fifth transmission line in the first metal layer and a sixth transmission line in the second metal layer, said fifth and sixth transmission lines being vertically aligned with each other and running parallel to the first, second, third, and fourth transmission lines, said fifth transmission line being electrically connected to a nearest of the transmission lines, of the second metal layer through at least one said via, and said sixth transmission line electrically connected to a nearest of the transmission lines of the first metal layer through at least one said via.

17. The transmission line element of claim 14, wherein the integrated circuit includes a region, between portions of the first and second transmission lines, where the first and second transmission lines are discontinuous, but the third and fourth transmission lines are continuous.

18. The transmission line element of claim 17, wherein in said region, other portions of the first and second transmission lines cross the third and fourth transmission lines.

19. A transmission line element, in an integrated circuit chip, comprising:

a plurality of metal layers in the integrated circuit chip, each of said metal layers being separated from an adjacent said metal layer by at least one dielectric layer; and a plurality of parallel conductors each comprising at least two parallel transmission lines in an electrical connection with one another, each of the transmission lines being formed in one of the metal layers, wherein at least one of the transmission lines of each said conductor is in a different said metal layer than another of the transmission lines of the same conductor, and wherein each of the at least two transmission lines in each said conductor is edge-coupled to at least one transmission line of another said conductor, and broadside-coupled to at least one transmission line of another said conductor.

20. The transmission line element of claim 19, wherein none of the at least two transmission lines in any said conductor is either edge coupled or broadside coupled to any other of the at least two transmission lines of the same conductor.

21. The transmission line element of claim 19, wherein each transmission line of each of the conductors is electrically connected to a different said transmission line of the same conductor at at least two points, each of the at least two points comprising a via that extends through at least one of the dielectric layers.

22. The transmission line element of claim 19, wherein each said conductor comprises at least two segments, wherein a linear length of each said segment is less than 30 degrees of an operating frequency of a transformer formed by the plurality of conductors.

23. A transmission line element formed in an integrated circuit chip comprising:

at least first and second conductors in the integrated circuit extending parallel to one another, the at least first and second conductors each comprising at least two parallel transmission lines, at least some of the transmission lines of the respective conductor being in different metal layers of the integrated circuit chip, each said metal layer being separated from an adjacent said metal layer by a dielectric layer;

a plurality of interconnects located at predetermined positions along said conductors, each of said interconnects containing an electrical connection between the transmission lines of each of respective at least first and second conductors, wherein a linear distance along the respective conductors between adjacent pairs of the interconnects is less than 30 degrees of an operating frequency of a transformer including the at least first and second conductors.

24. The transmission line element of claim 23, wherein at least one transmission line in each of the at least first and second conductors is edge-coupled to at least one said transmission line in another said conductor and broadside-coupled to at least one other said transmission line in another said conductor.

25. The transmission line element of claim 24, wherein every transmission line in each of the at least first and second conductors is edge-coupled to at least one said transmission line in another said conductor and broadside-coupled to at least one other said transmission line in another said conductor.

26. The transmission line element of claim 24, wherein every transmission line in each of the at least first and second conductors is edge-coupled to at least one said transmission line in another said conductor and broadside-coupled to at least one other said transmission line in another said conductor, and none of the transmission lines of any of the at least first and second conductors is edge-coupled or broadside coupled to any other of the transmission lines of the same conductor.

* * * * *